United States Patent [19]
Yoshida et al.

[11] Patent Number: 5,359,619
[45] Date of Patent: Oct. 25, 1994

[54] MULTI-BEAM SEMICONDUCTOR LASER AND METHOD FOR PRODUCING THE SAME

[75] Inventors: Ichiro Yoshida; Tsukuru Katsuyama; Junichi Hashimoto, all of Yokohama, Japan

[73] Assignee: Sumitomo Electric Industries, Ltd., Osaka, Japan

[21] Appl. No.: 19,652

[22] Filed: Feb. 19, 1993

[30] Foreign Application Priority Data

Feb. 20, 1992 [JP] Japan ................................ 4-033334
Mar. 11, 1992 [JP] Japan ................................ 4-052427
Jun. 1, 1992 [JP] Japan ................................ 4-140748

[51] Int. Cl.$^5$ ............................................. H01S 3/19
[52] U.S. Cl. ................................................ 372/50
[58] Field of Search ................... 372/44, 45, 46, 49, 372/50

[56] References Cited

U.S. PATENT DOCUMENTS

5,084,894 1/1992 Yamamoto ............................. 372/46

FOREIGN PATENT DOCUMENTS

0160515 11/1985 European Pat. Off. .
0384756 8/1990 European Pat. Off. .
2312162 10/1973 Fed. Rep. of Germany .

OTHER PUBLICATIONS

Patent Abstracts of Japan, vol. 11, No. 99 (E-493) 27 Mar. 1987 & JP-61 248 584 (NEC) 5 Nov. 1986 *abstract*.
Patent Abstracts of Japan, vol. 13, No. 2 (E-700) 6 Jan. 1989 & JP-A-63 215 088 (Matsushita Electric) 7 Sep. 1988 *abstract*.
Patent Abstracts of Japan, vol. 16, No. 23 (E-1157) 21 Jan. 1992 & JP-A-03 240 286 (Fuji Electric) 25 Oct. 1991 *abstract*.
Kapon et al, "Longitudinal-Mode Control in Integrated Semiconductor Laser Phased Arrays by Phase Velocity Matching", Applied Physics Letters, vol. 44, No. 2, Jan. 1984, New York, US, pp. 157–159.
Fujii et al, "High-Power Operation of a Transverse-Mode Stabilised AlGaInP Visible Light Semiconductor Laser", Electronics Letters, vol. 23, No. 18, 27 Aug. 1987, Stevenage, GB pp. 938–939.
Patent Abstracts of Japan, vol. 8, No. 66 (E-234) 28 Mar. 1984 & JP-A-58 215 087 (Toukiyou Kogyo Daigaku) 14 Dec. 1983 * abstract *.
Patent Abstracts of Japan, vol. 15, No. 229 (E-1076) 11 Jun. 1991 & JP-A-03 066 181 (Matsubishi Electric) 20 Mar. 1991 * abstract *.

*Primary Examiner*—John D. Lee
*Assistant Examiner*—Robert E. Wise
*Attorney, Agent, or Firm*—Cushman, Darby & Cushman

[57] ABSTRACT

This is disclosed a multi-beam semiconductor laser comprising: an active layer; a first and second cladding layer sandwiching the active layer, the second cladding layer being made of a first material; a contact layer provided on the second cladding layer; a current block layer provided in the second cladding layer, the current block layer being made of a second material and being spaced from the active layer with a predetermined distance; a dividing part provided above the current block for physically dividing the contact layer into two areas; and electrodes respectively provided on the divided areas of the contact layer.

14 Claims, 14 Drawing Sheets

MULTI-BEAM SEMICONDUCTOR LASER AND METHOD FOR PRODUCING THE SAME

BACKGROUND OF THE INVENTION

1. Field of the Invention

This invention relates to a multi-beam semiconductor laser having plural emission regions which are formed on the same substrate, and which can be driven independently, and a method for producing the multi-beam semiconductor laser. More specifically, the multi-beam semiconductor laser has so designed that the plural emission regions are formed in the same active layer on the same substrate.

2. Related Background Art

Presently, a semiconductor laser has been widely used for a laser printer, an optical disk, etc., however, the drawing (printing) speed of the laser printer or the data transfer speed of the optical disk has been not necessarily sufficiently high. If two laser beams which can be generated independently and adjacently to each other on a single substrate, a system having the drawing (printing) speed and data transfer speed which are two times as high as those of an ordinary system could be expected to be implemented with one optical system. In order to implement such a system, a multi-beam semiconductor laser has been researched and developed.

It has been conventionally believed that each of plural emission regions can not be independently driven due to electrical cross-talk when active layers for the emission regions are not physically separated from one another. This is pointed out in "Properties of closely spaced independently addressable lasers fabricated by impurity-induced disordering", Appl. Phys. Lett. 56, (17), Apr. 23, 1990.

Therefore, no multi-beam semiconductor laser in which the active layers are not separated, that is, the emission regions are formed in the same active layer has conventionally existed in the multi-beam semiconductor lasers in which the emission regions are independently driven.

One of the conventional multi-beam semiconductor lasers in which the emission regions are independently driven is disclosed in Japanese Laid-open Patent Application No. 3-145779.

In addition, there has been known a multi-bean semiconductor laser in which the respective emission regions are not driven independently, but simultaneously to merely obtain high output power. This type of multi-beam semiconductor laser is disclosed in "High-power AlGaInP three-ridge type LASER diode array", ELECTRONICS LETTERS 17th 1988 Vol. 24 No. 6.

A technique using an etching stopper is disclosed in "HIGH-POWER OPERATING OF A TRANSVERSE-MODE STABILIZED AlGaInP VISIBLE LIGHT ($\lambda_L$)=683 nm) SEMICONDUCTOR LASER", ELECTRONICS LETTERS Aug. 27, 1987, Vol. 23, No. 18, p938–939, for example.

SUMMARY OF THE INVENTION

If not only an upper cladding layer between the neighboring emission regions but also an active layer therebetween are removed by the etching or the like, no current cross-talk occurs, but it is difficult to induce laser oscillation. In view of the above, the inventor tentatively made a multi-beam type semiconductor laser whose emission regions were formed in the same active layer.

FIG. 1 is a cross-sectional view of a tentatively-made multi-beam type semiconductor laser. In this laser, an n-type buffer layer 2, an n-type cladding layer 3, an active layer 4, and a p-type cladding layer 5 were formed in this order on an Si-GaAs substrate 1. The p-type cladding layer 5 had two mesa portions 6a and 7a which were located so as to correspond to two emission regions 21 and 22, and p-type cap layers 6b and 7b were formed at the flat top of the mesa portions 6a and 7a respectively to thereby form two large-size whole mesa portions 6 and 7.

The mesa portions 6 and 7 were formed so as to extend in a direction vertical to the drawing of FIG. 2. An n-type current block layer 8 was formed at both sides of each of the mesa portions 6 and 7 to concentratively supply current to the active layer 4 at the positions facing the mesa portions 6 and 7 and thus improve emission efficiency. In addition, a p-type contact layer 9 was further formed so as to cover the cap layers 6b and 7b and the current block layer 8. Thereafter, in order to electrically separate the emission regions 21 and 22 from each other, a separation portion 12 of the p-type contact layer 9 was removed by the etching treatment.

On each of the surfaces of the thus-separated two p-type contact layers 9 was formed an ohmic electrode 10 which was obtained by an alloying process. In addition, on the bottom surface of the substrate 1 was formed an ohmic electrode 11 which was obtained by the alloying process.

Since the two emission regions 21 and 22 were separated from each other through the current block layer 8, laser beams should be emitted from respective areas of the active layer 4 which corresponded to the emission regions 21 and 22 while their driving was controlled independently of each other.

However, several problems occurred when the two emission regions were independently driven in the tentatively-made multi-beam semiconductor laser as shown in FIG. 1.

A first problem was the current cross-talk due to current leak in the surface of the current block layer 8 at the separation portion 12 from which the contact layer 9 was removed. A second problem was the current crosstalk due to current flow into the p-type cladding layer 5 under the current block layer 8. These problems must be originally solved.

A third problem was the ununiformity of characteristics of laser beams emitted from the emission regions 21 and 22.

Particularly in order to use the laser beams emitted from the emission regions 21 and 22 commonly as an image write-in light for a laser printer, or a write-in/readout light for an optical disk, the characteristics of these laser beams are required to be uniform (equal) to each other.

The following two points are considered as a main cause of the first problem. One is that the removable of the contact layer 9 by the etching treatment is incomplete, so that the contact layer 9 on the current block layer 8 remains. The other point is that after the contact layer 9 is removed by the etching treatment, impurities in the atmosphere adhere to the surface of the current block layer 8 and thus the insulation property thereof is deteriorated.

Therefore, in order to completely separate the emission regions 21,22 from each other, it is necessary to remove the surface of the separation portion 12 of the current block layer 8 when the surface of the separation portion 12 is contacted with low-resistant substance (containing impurities in the atmosphere), and prevent the surface of the separation portion 12 from being contacted with the low-resistant substance again.

As a method of solving the second problem, it has been conventionally adopted that each of the active layer and the cladding layer is sectioned every emission region. On the other hand, it has been experimentally proved that the electrical cross-talk could be sufficiently depressed if the p-type cladding layer 5 under the current block layer, that is, the thickness d is so designed as to be thin. In addition, it has been also experimentally proved that if the p-type cladding layer 5 between the emission regions 21,22 is completely removed, an oscillation characteristic of each emission region 21,22 is rather deteriorated. This invention has been implemented on the basis of these experimental knowledge.

In order to solve the third problem, that is, in order to make uniform the characteristics of the laser beams emitted from the emission regions 21 and 22, the thickness d of the p-type cladding layer 5 under the current block layer 8 is required to be made uniform over all portions. If the thickness d is ununiform at each portion, the concentration (bottleneck) degree of current is varied every emission region, and thus the characteristics of the laser beam becomes ununiform.

The mesa portions 6a and 7a of the p-type cladding layer 5 are formed by the etching treatment using a striped SiN film as a mask, and in this case, slender portions which are located between the stripes are hardly etched, so that it is difficult to keep the thickness of the p-type cladding layer to be uniform at each portion. This trend is remarkable particularly in a case where three or more mesa portions are formed to obtain three or more laser beams.

The following method is a generally-applied effective method for improving the uniformity of the etching to overcome the above problem. That is, the p-type cladding layer 5 is divided into an inner cladding layer and an outer cladding layer, and an etching stopper layer (not shown) is provided between the inner and outer cladding layers. The mesa portions 6a and 7a are formed of the outer cladding layer. According to this construction, the etching of the outer cladding layer can be surely prevented by the etching stopper layer, and thus the thickness of the inner cladding layer under the current block layer 8 can be surely made uniform.

However, in the above technique for promoting the uniformity of the etching with an etching stopper occurs a problem that the current cross-talk becomes large, and it is difficult to control the respective emission regions independently of each other.

This problem will be described in detail. When the etching treatment is stopped by the etching stopper layer, at least a part of the etching stopper remains on the inner cladding layer. Such remain of the etching stopper layer causes current leakage in the etching stopper layer or through an interface between the etching stopper layer and the inner cladding layer.

Such current cross-talk, that is, the leakage of the current is more increased not only when the etching stopper layer remains wholly, but also when even a part of the etching stopper layer remains.

Here, defining "(etching rate of etching stopper material)/(etching rate of cladding material)=speed ratio", the speed ratio of an etchant is preferably as large as possible until the etching process reaches the etching stopper layer. And the speed ratio of another etchant to remove the etching stopper layer is preferably as small as possible.

Through this processes, the thickness of the layer can be surely controlled, and the etching stopper layer which will cause the current cross-talk can be removed.

This invention has been implemented on the basis of the above experimental results and consideration thereto, and an object of this invention is to provide a multi-beam semiconductor laser having little cross-talk without removing the upper-side cladding layer and the active layer between the emission regions.

This invention is a multi-beam semiconductor laser comprising:
an active layer;
a first and second cladding layer sandwiching the active layer, the second cladding layer being made of a first material;
a contact layer provided on the second cladding layer;
a current block means provided in the second cladding layer, the current block means being made of a second material and being spaced from the active layer with a predetermined distance;
dividing means provided above the current block means for physically dividing the contact layer into two areas; and
electrodes respectively provided on the divided areas of the contact layer.

Further, this invention is a process for producing a multi-beam semiconductor laser comprising:
a step of forming an active layer;
a step of forming a first cladding layer made of a first material on the active layer;
a step of forming an etching blocking layer made of a second material on the first cladding layer;
a step of forming a second cladding layer made of a third material on the etching blocking layer;
a step of etching a prescribed region of the second cladding layer till the etching blocking layer is exposed by first etchant;
a step of etching the exposed region of the etching blocking layer till the first cladding layer is exposed by second etchant; and,
a step of forming a current block means on the exposed region of the first cladding layer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art:form this detailed description.

DETAILED DESCRIPTION OF PREFERRED EMBODIMENTS

Preferred embodiments according to this invention will be hereunder described with reference to the accompanying drawings.

Figure 2:
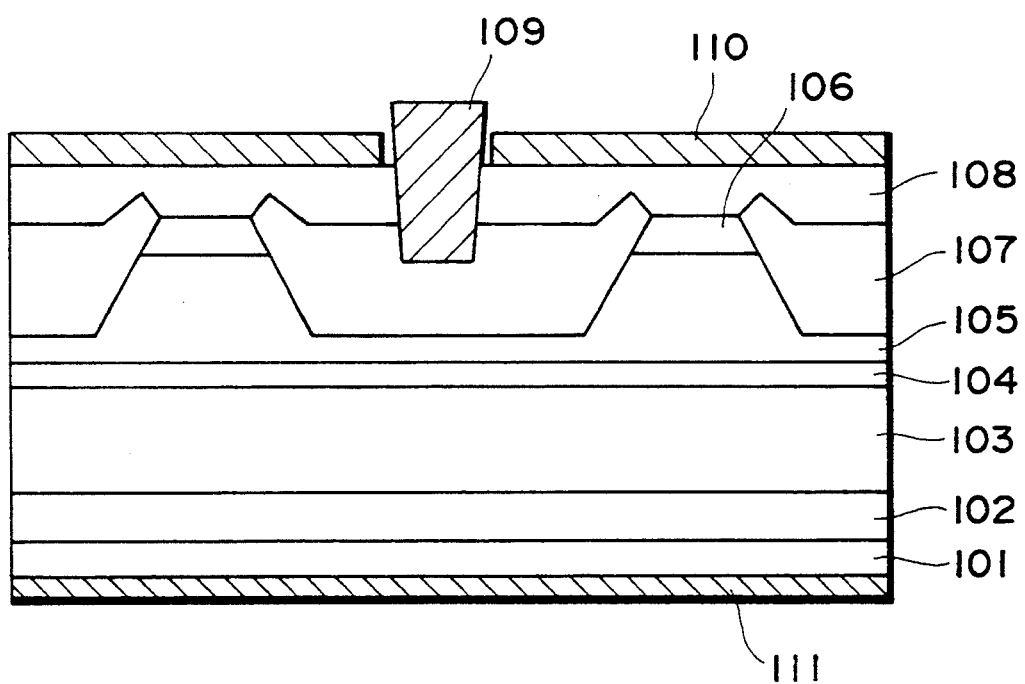
FIG. 2 is a cross-sectional view of a first embodiment of this invention.

FIG. 2 is a cross-sectional view of an embodiment of a multi-beam semiconductor laser according to this invention. The construction of the multi-beam semiconductor laser having two emission regions will be hereunder described with reference to FIG. 2.

In the multi-beam semiconductor laser as shown in FIG. 2, a buffer layer 102 (formed of Si-doped GaAs), a first cladding layer 103 (formed of Se-doped AlGaInP) and an active layer 104 (formed of undoped GaInP) are formed on a Si-doped GaAs substrate 101 in this order.

A second cladding layer 105 (formed of Zn-doped AlGaInP) is formed on the active layer 104. The second cladding layer 105 has two mesa (projecting) portions at the positions corresponding to emission regions, and it continuously covers the active layer 104. In addition, a cap layer 106 (formed of Zn-doped GaInP) is formed on the flat tip portion of each of these two projecting portions.

A current block layer 107 (formed of Si-doped GaAs) is further formed on the second cladding layer 105 excluding those portions on which the cap layers 106 are formed. That is, the current block layer 107 is formed so as to be filled into a space between the two mesa portions (containing the outside of each mesa portion) each comprising the cap layer 106 and the second cladding layer 105.

A contact layer 108 of Zn-doped GaAs is formed on the second cladding layer 105 and the current block layer 107. A groove is formed at the central portion so as to be penetrated from the surface of the contact layer 108 therethrough to an upper portion of the current block layer 107, and high-resistant material of silicon nitride is embedded into the groove to form a silicon nitride film 109 in the groove.

A positive electrode 110 is formed on each of the two contact layers 108 which are separated through the silicon nitride film 109, and a negative electrode 111 is formed on the back surface of the GaAs substrate 101.

FIG. 2 illustratively shows the structure of the multi-beam semiconductor laser, and thus the dimensional ratio of the respective elements does not correspond to that of the actual elements. For example, an actual semiconductor laser is so designed that the thickness of the GaAs substrate 101 is about 70 $\mu$m, the total thickness of the layers from the buffer layer 102 to the cap layer 106 on the GaAs substrate 101 is about 2 to 3 $\mu$m, and the thickness of the contact layer 108 is about 2 $\mu$m.

Each of the GaAs substrate 101, the buffer layer 102, the first cladding layer 103 and the active layer 104 is commonly used for both of the emission regions. The negative electrode 111 is also commonly formed for these emission regions while the positive electrodes 110 are separately formed for these emission regions. On the other hand, the contact layer 108 is divided into two sections in correspondence to the two emission regions by both of the groove formed by the etching treatment and the silicon nitride film 109 embedded into the groove.

The second cladding layer 105 is formed as a continuous layer, and, has two mesa (projecting) portions each of which corresponds to each emission region. The cap layers 106 are separately formed in correspondence to the respective emission regions, and the current block layer 107 is formed so as to allow current to be concentrated into the active layer 104 in the two emission regions.

A method for producing the multi-beam semiconductor laser thus constructed will be next described with reference to FIGS. 3A to 3F and FIGS. 4A to 4E.

Figure 3A:
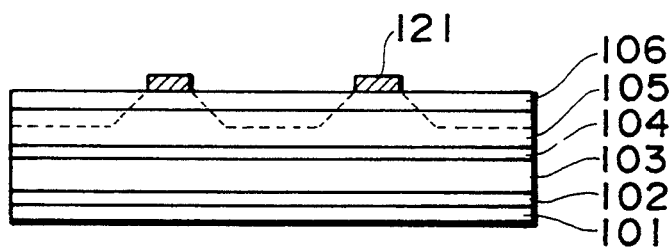
FIGS. 3A, 3B, 3C, 3D, 3E, and 3F are cross-sectional views for a manufacturing process the first embodiment.
Figure 3B:
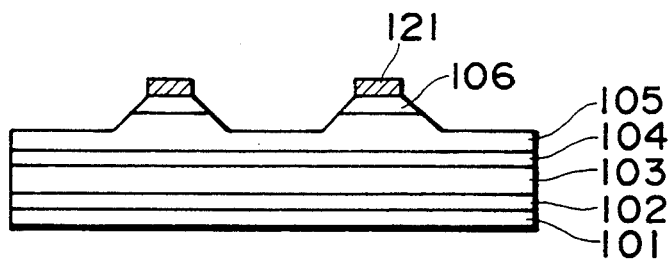

The buffer layer 102, the cladding layer 103, the active layer 104, the first cladding layer 105 and the cap layer 106 are successively formed on the GaAs substrate 101 by an epitaxial growth method, and then the silicon nitride film 121 is formed (FIG. 3A). The silicon nitride film 121 was subjected to a patterning process because it is used as a mask in a next process where a portion as indicated by a broken line is removed by the etching treatment.

Figure 3C:
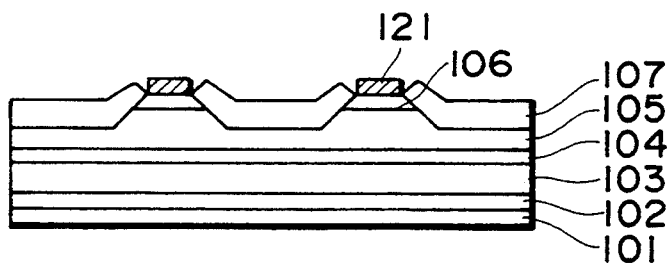
Figure 3D:
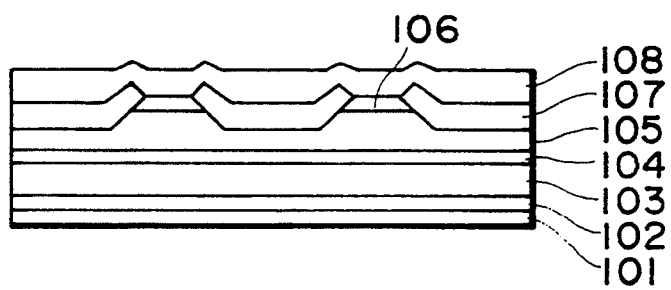

Subsequently, an etching process is carried out (FIG. 3B), and then the current block layer 107 is grown at the etched portion (FIG. 3C). Thereafter, the silicon nitride film 121 is removed to grow the contact layer 108 over the whole surface (FIG. 3D).

Figure 3E:
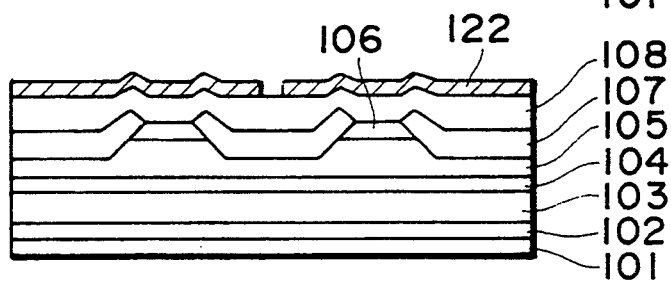
Figure 3F:
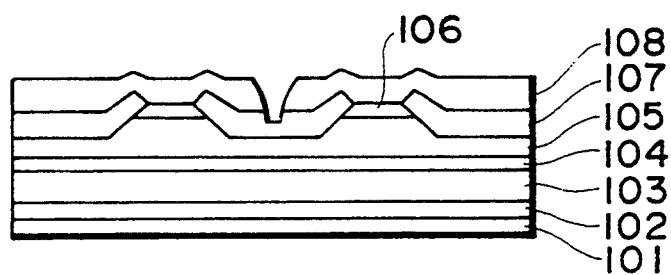

Subsequently, a patterned silicon nitride film 122 is formed (FIG. 3E). An etching process for electrically separating the respective emission regions is carried out using the silicon nitride film 122 as a mask, and then the silicon nitride film 122 is removed (FIG. 3F). This etching process is carried out so that the contact layer 108 is completely removed and the current block layer 107 below the contact layer 108 is partially (halfway) removed.

If at this time the etching process is further continued so that the etching penetrates through the current block layer 107 and reaches the second cladding layer 105 below the current block layer 107, the current would slightly flow along the exposed surface, and crosstalk slightly would occur again. Therefore, it is desirable to carry out this etching for isolation in such a depth that the etching extends the current block layer 107, but does not extend the second cladding layer 105.

Figure 4A:
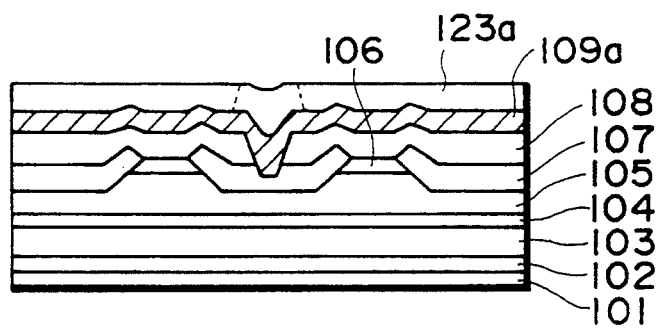
FIGS. 4A, 4B, 4C, 4D, and 4E are cross-sectional views for another manufacturing process of the first embodiment.
Figure 4B:
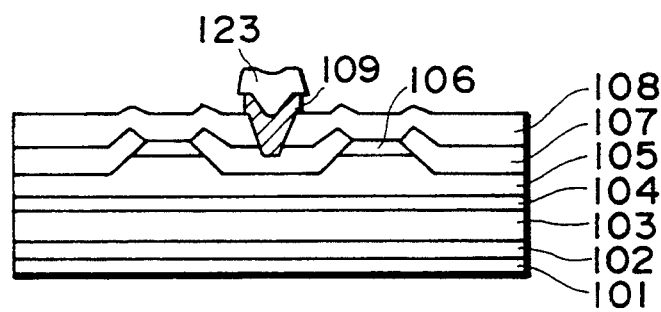

Thereafter, a silicon nitride film 109a and a resist film 123a are formed on the whole surface (FIG. 4A), then the resist film 123a is subjected to a patterning treatment by a photolithography, and then the silicon nitride film 109a is etched using the resist pattern 123 as a mask to remain only the silicon nitride film 109 (FIG. 4B).

Figure 4C:
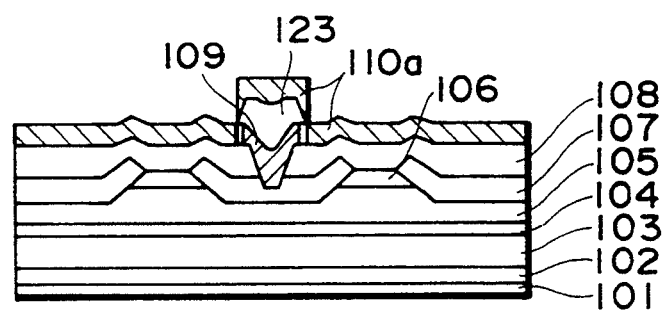
Figure 4D:
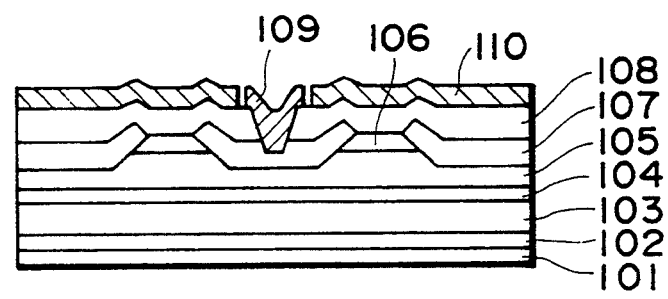
Figure 4E:
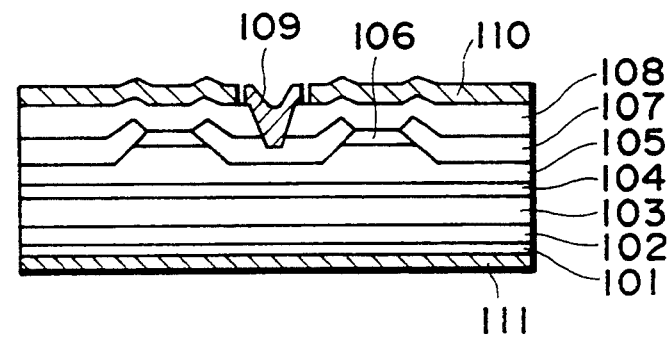

Subsequently, a metal film 110a comprising a three-layered film of Ti/Pt/Au is formed on the whole surface of the contact layer 108 and the silicon nitride film 109a (FIG. 4C). And then a surplus part of the metal layer 110 is removed by the etching treatment to form positive electrodes 110 for the emission regions. Thereafter, the resist pattern 123 is removed (FIG. 4D), and finally a negative electrode 111 comprising a three-layered film of AuGe/Ni/Au is formed on the back surface of the substrate 101 (FIG. 4E).

When laser oscillation was induced in one of the emission regions in the multi-beam semiconductor laser thus produced, no emission occurs in the other emission region, and the resistance between the positive electrodes 110 was a large value about 2000Ω.

There are some cases where the buffer layer 102 may be eliminated from the structure of the above multi-beam semiconductor laser. There are some cases where the cap layer 106 may be eliminated.

According to the first embodiment of the multi-beam semiconductor laser, after the contact layer 108 is formed on the current block layer 107, the interface between the contact layer 108 and the current block layer 107 is surely removed by the etching treatment and the high-resistant material is embedded into the etched portion. Through this process, the current cross-talk on the surface of the current block layer 107 is depressed.

On the other hand, as a method which is different from the above method, no contact layer is formed at the separated portion on the current block layer from the beginning. This method will be hereunder described as a second embodiment of this invention.

Figure 5:
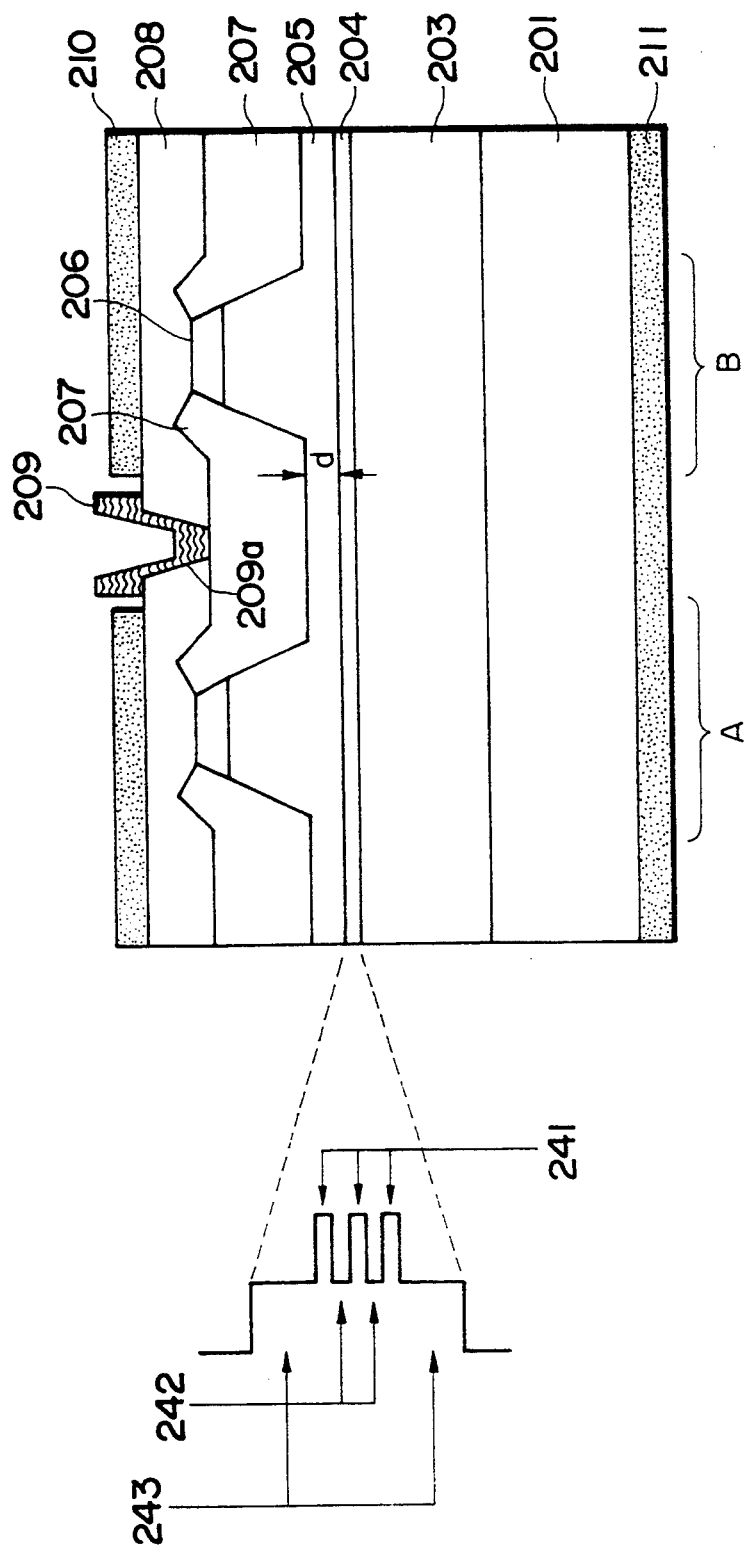
FIG. 5 is a cross-sectional view of a second embodiment of this invention.

FIG. 5 is a cross-sectional view of a second embodiment of the multi-beam semiconductor laser.

A first cladding layer 203 of Se-doped AlGaInP and an active layer 204 are formed on a Si-doped GaAs substrate 201 in this order, and then a second cladding layer 205 of Zn-doped AlGaInP is formed on the active layer 204. The second cladding layer 205 has two mesa (projecting) portions which correspond to emission regions, and is so designed as to physically continuously cover the active layer 204. A cap layer 206 of Zn-GaInP is further formed on the flat top portion of each of the mesa portions.

In addition, a current block layer 207 of Si-doped GaAs is formed on the second cladding layer 205 excluding those areas on which the cap layers 206 are formed. That is, the current block layer 207 is so formed as to be embedded between the two mesa portions (containing the both sides of the mesa portions) each comprising the cap layer 206 and the second cladding layer 205.

In addition, a contact layer 208 of Zn-doped GaAs is formed on the second cladding layer 205 and the current block layer 207, and a silicon nitride film 209, structurally separating the contact layer 208, is formed on the surface of the central portion of the current block layer 207 through which the two emission regions are separated from each other.

A positive electrode 210 is formed on each of the two separated contact layers 208, and a negative electrode 211 is formed on the back surface of the GaAs substrate 210.

The multi-beam semiconductor laser of this embodiment can be regarded as a AlGaInP-group semiconductor laser, and the term "AlGaInP-group" used in the following description contains GaInP when the active layer has no Al component, and AlInP when the cladding layer has no Ga component.

Similarly in the first embodiment, the active layer 204 may be formed of undoped GaInP, however, in this embodiment it is formed of material having an energy band of strain multiple quantum well structure as shown at the left side of FIG. 5. The strain multiple quantum well structure will be hereunder described in detail.

As shown in FIG. 5, the active layer 204 comprises well layers 241 each of which has 100 A thickness and is formed of undoped $Ga_{0.43}In_{0.57}P$, barrier layers 242 for separating the well layers 241 from one another, each of which has 80 A thickness and is formed of undoped $(Al_{0.4}Ga_{0.6})_{0.5}In_{0.5}P$, and light enclosing layers 243 each of which has 800 A thickness and is formed of the same material as the barrier layer 242. Such a technique for forming the active layer in the above multiple quantum well structure has been publicly well known. When the material having the composition ratio of this embodiment as described above is adopted for the active layer, the active layer suffers a compressive strain.

FIG. 5 schematically shows the structure of this embodiment. The dimensional ratio of the respective elements does not necessarily correspond to that of the actual elements. For example, the actual structure is so designed that the thickness of the GaAs substrate 201 is about 70 μm, the total thickness of the layers from the cladding layer 203 to the cap layer 206 is about 2 to 3 μm, and the thickness of the contact layer 208 thereon is about 2 μm.

Each of the first cladding layer 203, the active layer 204 and the second cladding layer 205 is commonly used for the emission regions A and B. The second cladding layer 205 is so designed to be thinned between the emission regions, and the thinned portions have the thickness d of 2000Å. A separation groove 209 is formed in the contact layer 208. The separation groove 209a extends to the surface of the current block layer 207, and a silicon nitride film 209 is embedded into the groove 209a to separate the two emission regions from each other electrically. By thinning the second cladding layer 205 between the emission regions like this embodiment, the electrical cross-talk between the emission regions can be practically sufficiently depressed. If the second cladding layer at this portion is removed, the oscillation characteristic of each emission region would be deteriorated, and thus it is important to sufficiently thin the second cladding layer 205 to the extent that it is not removed.

In order to obtain a practically-useful multi-beam semiconductor laser, a thermal cross-talk as well as the electrical cross-talk is required to be depressed. That is, since the semiconductor laser has a characteristic that the output thereof is decreased as the temperature rises up, it is required to depress the decrease of the outputs of the other emission regions due to heat generation at a driving time. As methods for satisfying this requirement are listed the following methods; (1) a method of preventing heat transfer between the emission regions, (2) a method of making each emission region suffer little heat affection, and (3) a method of making each emission region have a structure which hardly generates heat. The third method is adopted in this embodiment. That is, the active layer is designed in the strain multiple quantum well structure to lower a threshold current and depress the heat generation. In other words, the active layer suffers the compressive strain to lower the threshold current, and its effect is improved by the multiple quantum well structure. Therefore, the heat generation at each emission region is depressed, and thus the outputs of the other emission regions are prevented from being depressed by the heat.

Next, a method of producing the multi-beam semiconductor laser thus constructed will be described with reference to FIGS. 6A to 7D.

Figure 6A:
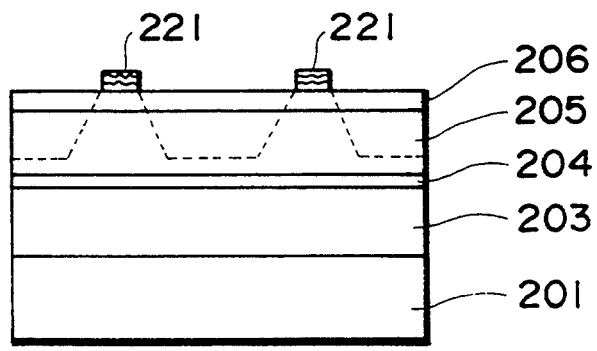
FIGS. 6A, 6B, 6C, and 6D are cross-sectional views for a manufacturing process of the second embodiment.

First, the first cladding layer 203, the active layer 204, the second cladding layer 205 and the cap layer 206 are successively formed on the GaAs substrate 201 by the epitaxial growth, and then the silicon nitride film 221 is formed (FIG. 6A).

A crystal growth temperature for each layer is set to 740° C. The doping amount of Se to be doped into the first cladding layer 203 is $2 \times 10^{17}$ cm$^{-1}$, and a doping amount of Zn to be doped into the second cladding layer 205 is $4 \times 10^{17}$ cm$^{-3}$. The thickness of the first cladding layer 203 and the second cladding layer 205 is set to 1 μm. The silicon nitride film 221 is patterned so that it is usable as a mask for a next process where a portion indicated by a broken line is removed by the etching treatment. Buffered hydrofluoric acid was used as an etchant in the above patterning process. In this embodiment, two patterned silicon nitride films 221 are so designed as to have a width of 5 μm and an interval of 15 μm between the centers thereof.

Figure 6B:
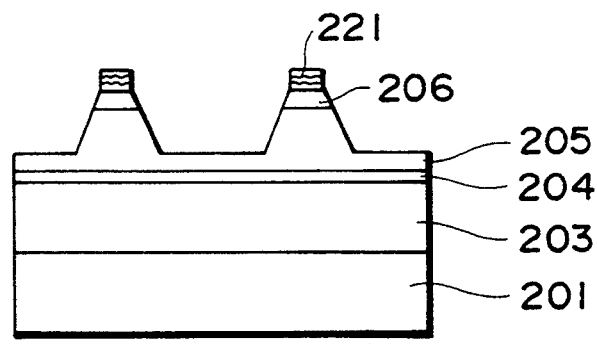
Figure 6C:
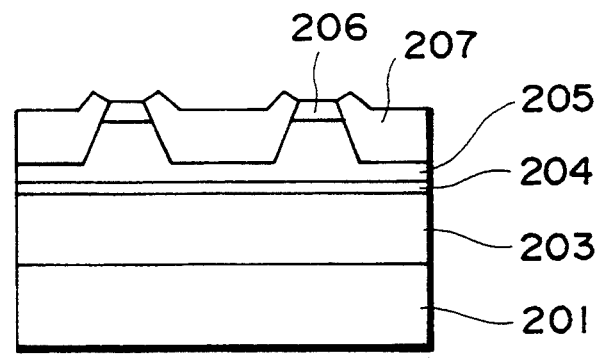
Figure 6D:
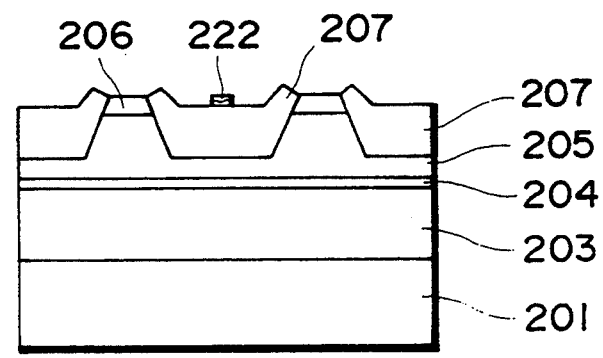

Subsequently, the mesa-etching treatment is carried out. In this embodiment, a mixed acid (sulfuric acid:hydrogen peroxide:water=3:1:1) at 50° C. is used as an etchant, and the etching treatment is carried out for six minutes, so that the second cladding layer 205 remains in 2000Å thickness (FIG. 6B). Thereafter, Si-doped GaAs (impurity concentration of $2 \times 10^{17}$ cm$^{-3}$) is grown in the etched portion to form the current block layer 207. The silicon nitride film 221 is removed by an etchant (hydrofluoric acid:water=1:1) (FIG. 6C). Thereafter, the silicon nitride film is formed over the whole surface, and the resist patterning process and the etching process are carried out so that the silicon nitride film 222 partially remains at a part between the emission regions (FIG. 6D).

Figure 7A:
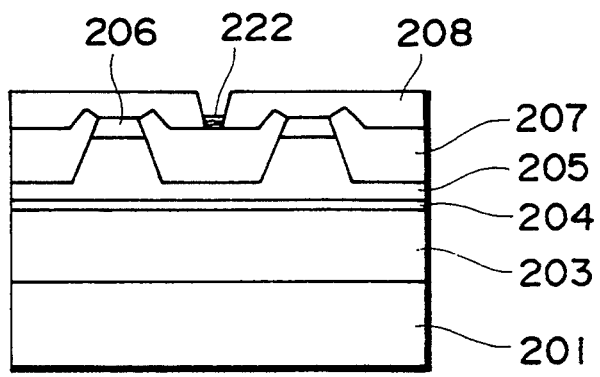
FIGS. 7A, 7B, 7C, and 7D are cross-sectional views for another manufacturing process of the second embodiment.
Figure 7B:
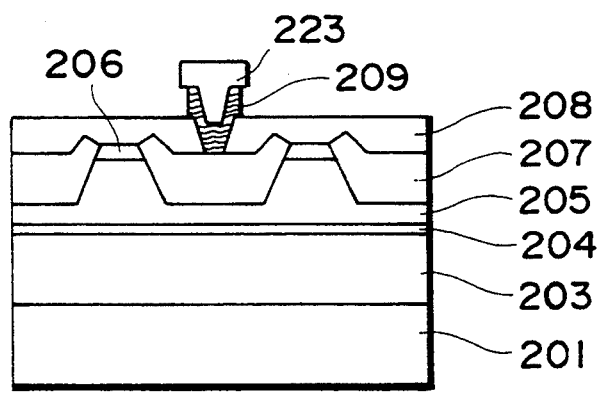

Subsequently, Zn-doped GaAs (impurity concentration of $1 \times 10^{19}$ cm$^{-3}$) is grown in 1 μm thickness. At this time, the Zn-doped GaAs is not grown at the portion where the silicon nitride film 222 remains, so that the two separated contact layers 208 are formed (FIG. 7A). Thereafter, the silicon nitride film 222 is removed, and a silicon nitride film is newly formed over the whole surface. Further, a resist pattern 223 is formed on the separated portion of the contact layers 208, and the silicon nitride film is removed using the resist pattern 223 as a mask by the etching treatment, so that the patterned silicon nitride film 209 remains (FIG. 7B).

Figure 7C:
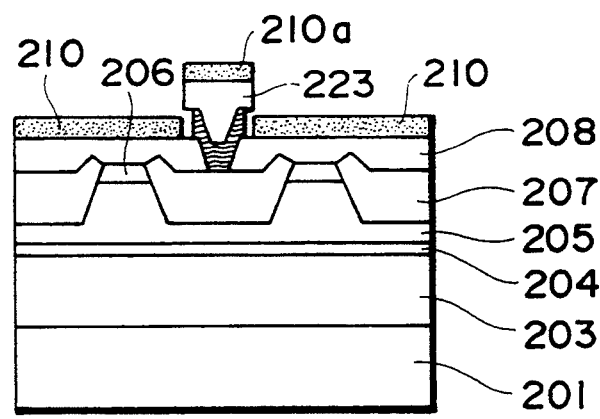
Figure 7D:
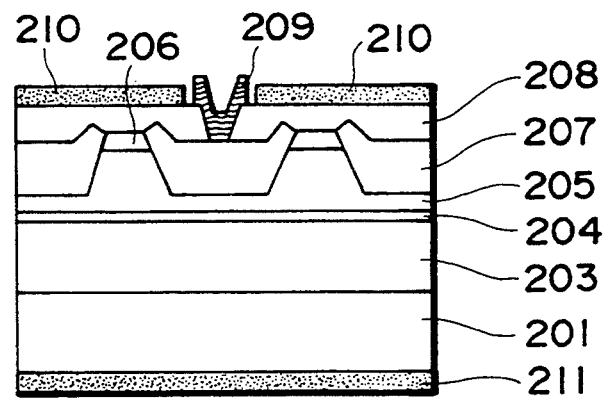

Subsequently, metal films 210 and 210a each comprising a three-layered film of Ti/Pt/Au is formed on the whole surface by a vapor deposition method (FIG. 7C). Thereafter, the resist pattern 223 is removed with acetone to lift off the metal film 210a on the resist pattern 223, so that the positive electrode 210 remains every emission region. Subsequently, the GaAs substrate 201 is etched from the back surface thereof to make the thickness of the GaAs substrate 201 about 70 μm, and then the negative electrode is formed on the back surface of the GaAs substrate 201 by the vapor deposition method. Thereafter, an alloying treatment is carried out at 400° C. in nitrogen atmosphere for one minute to form the negative electrode 10 of three-layered film of AuGe/Ni/Au (FIG. 7D).

Figure 8:
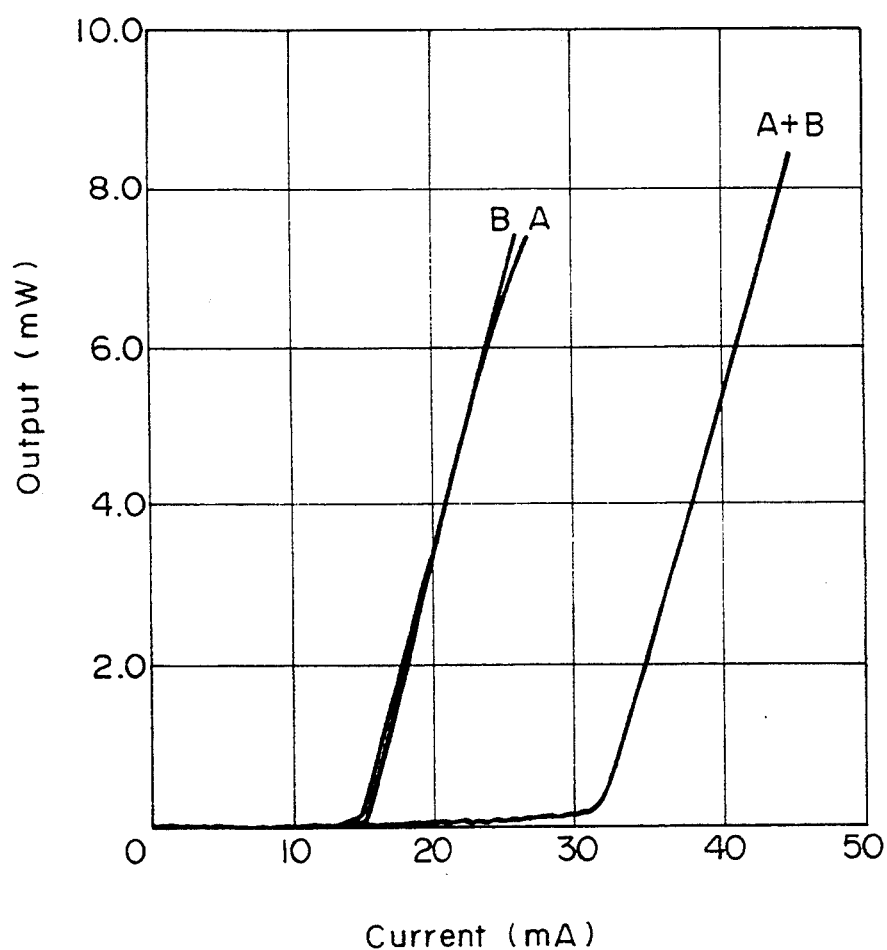
FIG. 8 is a graph showing a current-light output characteristic of the second embodiment.

The multi-beam semiconductor laser thus formed is clove into a chip in width of 400 μm and resonance length about 250 μm to form a multi-beam semiconductor laser having two emission regions, and is mounted with gold/tin solder containing 20% tin for facing the epitaxial growth surface up. FIG. 8 is a graph showing the current-light output characteristic of each emission region of the thus-mounted multi-beam semiconductor laser.

The solid lines A and B of FIG. 8 represent the characteristics of the emission regions A and B respectively when those emission regions are independently driven, and the soli line C represents the characteristic of the emission regions A and B when the positive electrodes of the emission regions A and B are short-circuited. It is apparent from the graph that the threshold current when the emission regions are short-circuited is two times as large as the threshold current when the emission regions are independently driven. Further, upon observing a near-field pattern when one emission region is turned on, no emission is observed for the other emission region.

In addition, upon measuring the resistance between the positive electrodes of both emission regions, that is, the voltage-current characteristic, it was found out that the resistance value was non-linear, and it was lowered as an applied voltage is decreased whereas it was fixed to a substantially constant value of 10 KΩ in a minute-voltage range below 0.1 volt. That is, in the semiconductor laser of this embodiment, it is found out that the resistance value between the positive electrodes is set to 10 KΩ or more at all times, and thus the current crosstalk is very slight.

If the resistance value between the positive electrodes is above 1 KΩ, the respective emission regions can be mutually independently driven to some extent. For example, as the thickness d of the second cladding layer between the emission regions is gradually increased, the resistance value between the positive electrodes is reduced, and the increase of the current cross-talk is observed. In this embodiment the thickness d is set to 0.2 μm, however, even when the thickness is set to 0.3 μm, the independent driving performance of the emission regions can be sufficiently assured.

When only the thickness d of the second cladding layer between the emission regions was set to 0.2 μm in the first embodiment, similarly in the second embodiment, the resistance value between the positive electrodes was measured to be above 10 KΩ.

Figure 1:
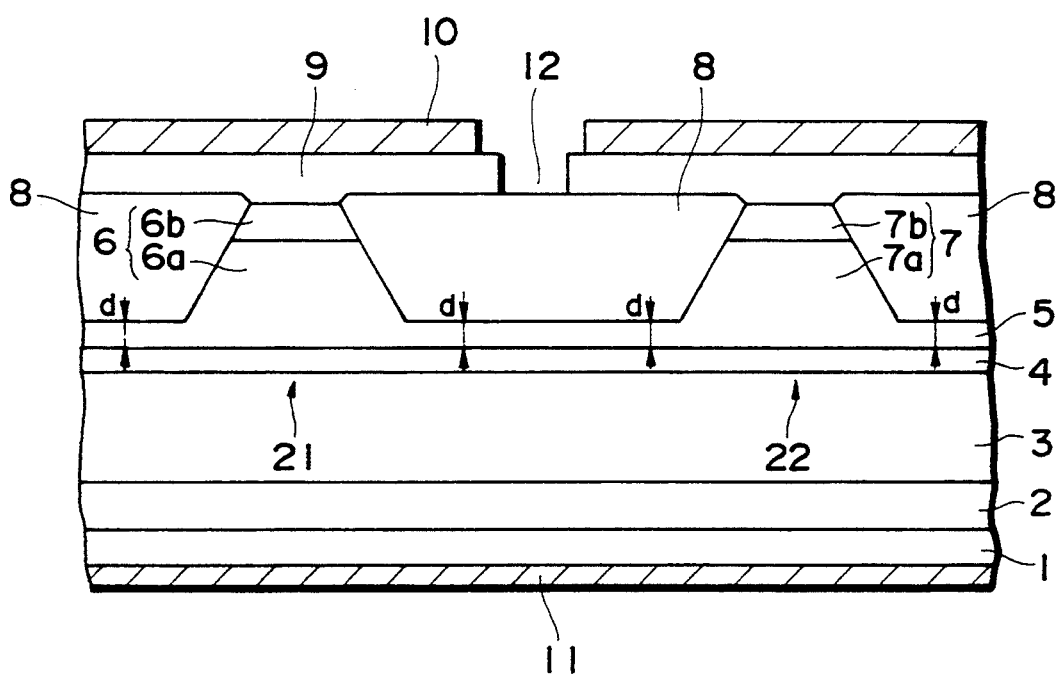
FIG. 1 is a cross-sectional view of a tentatively-made multi-beam semiconductor laser which is used as a base of this invention.

Further, it was found out that when the separation of the contact layer was carried out by only the etching treatment without the separation method as used in the first and second embodiments, that is, in a case of the tentatively-made example as shown in FIG. 1, the resistance value between the positive electrodes was increased if the thickness d of the second cladding layer between the emission regions was set to a value below 0.5 μm, and the current cross-talk was depressed. On the other hand, it was also found that when the second cladding layer between the emission regions were completely removed, that is, when the thickness d was set to zero, no current cross-talk occurs in the second cladding layer, however, the laser oscillation was hardly induced as described previously.

Figure 9:
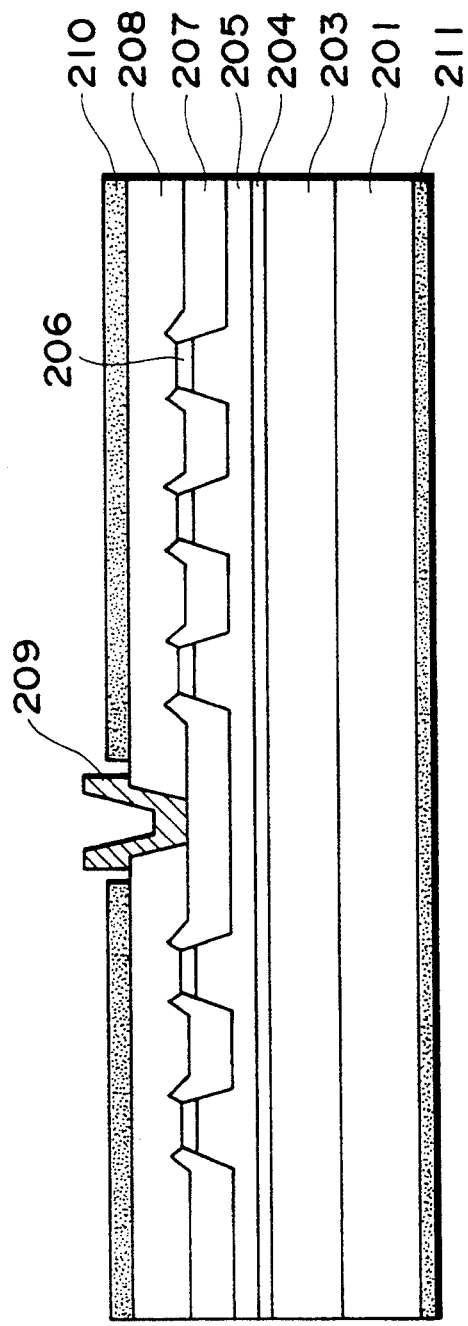
FIG. 9 is a cross-sectional view of a modification of the second embodiment.

FIG. 9 shows a modification of the second embodiment of the multi-beam semiconductor laser according to this invention. The similar elements to those of the second embodiment are represented by the same reference numerals, and the description thereof is eliminated. This modification has five emission regions, and one positive electrode 210 is commonly used for two emission regions at the left side while the other positive electrode 210 is commonly used for the other three emission regions at the right side. With this structure, the emission regions at the left side are simultaneously driven while the other emission regions at the right side are simultaneously drive, and two groups of the emission regions at the right and left sides are independently driven.

Figure 10:
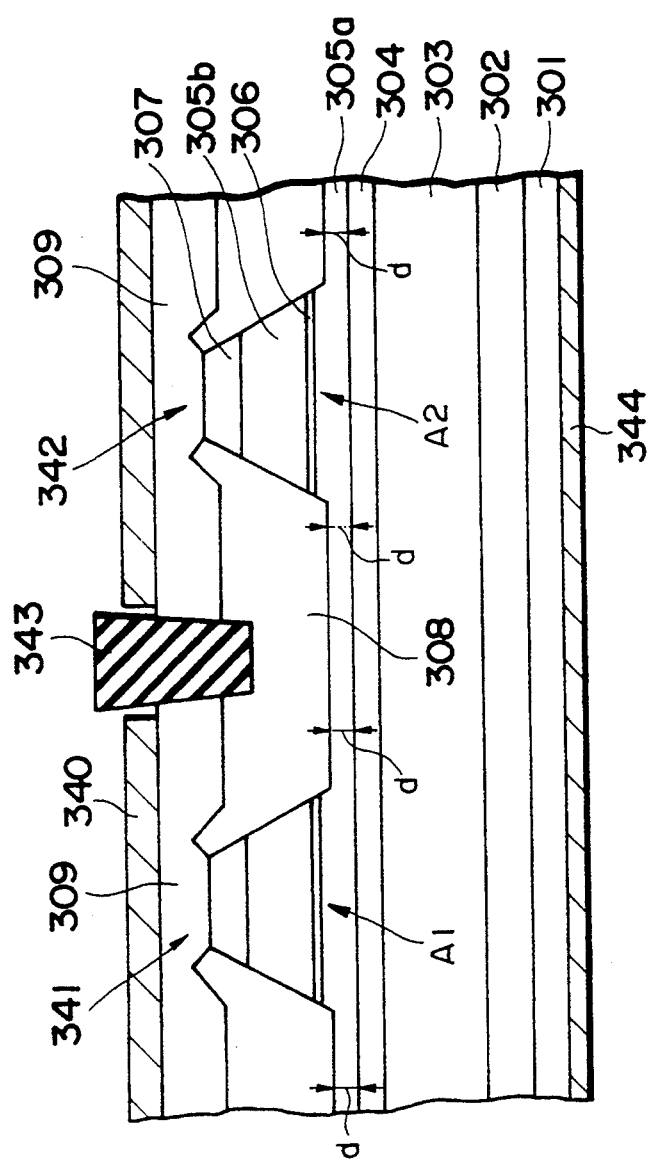
FIG. 10 is a cross-sectional view of a third embodiment of this invention.

FIG. 10 is a cross-sectional view of a third embodiment of the multi-beam semiconductor laser according to this invention. In this multi-beam semiconductor laser, an n-type buffer layer 302 of GaAs which is doped with Si as an n-type dopant, and an n-type first cladding layer 303 of Si-doped (Al$_{0.7}$Ga$_{0.3}$)$_{0.5}$In$_{0.5}$P are successively formed on an Si-doped GaAs semiconductor substrate 301 in this order. Further, an active layer of undoped GaInP is formed on the first cladding layer 303.

Further, a p-type second inner cladding layer 305a of (Al$_{0.7}$Ga$_{0.3}$)$_{0.5}$In$_{0.5}$P which is doped with Zn as a p-type dopant, an etching stopper layer 306 of Zn-doped Ga$_{0.5}$In$_{0.5}$P, a p-type second outer cladding layer 305b of Zn-doped (Al$_{0.7}$Ga$_{0.3}$)$_{0.5}$In$_{0.5}$P, and a p-type cap layer 307 of Zn-doped Ga$_{0.5}$In$_{0.5}$P are successively formed on the active layer 304.

A part of each of the cap layer 307, the second inner cladding layer 305a, the etching stopper layer 306 and the second outer cladding layer 305b is etched in a stripe form in a direction vertical to the drawing surface to constitute mesa-shaped portions 341 and 342 having a current enclosing structure whose cross section is trapezoidal. At both sides of each of the mesa (projecting) portions 341 and 342 are formed n-type current block layers 308 each of which serves to concentrate current into the mesa-shaped portions 341 and 342. The current block layers 308 are formed of Si-doped GaAs, for example.

Each surface of the cap layer 307 and the current block layer 308 is coated with an p-type contact layer 309 which is formed of Zn-doped GaAs, and a positive electrode 340 which is formed, for example, of Ti/Pt/Au, is formed on the surface of the contact layer 309. The electrode 340 is divided into two sections for the mesa portions 341 and 342 through a silicon nitride film 343. Therefore, the mesa portions 341 and 342 can be independently supplied with current. An negative electrode 344 is formed of AuGe/N/Au, for example.

The silicon nitride film 343 is embedded into a groove which is formed in such a depth that it extends the inside of the current block layer 308, and each of the contact layer 309 and the current block layer 308 is partially divided (separated) through the silicon nitride film 343. With this structure, the depression of the cross-talk is promoted (see the first embodiment).

According to the structure as described above, by selectively supplying current to the mesa portions 341 and 342, laser beams can be independently emitted from areas of the active layer 304 which are indicated by A1 and A2 respectively while independently controlling the emission of the laser beams. Therefore, the structure as described above can realize a multi-beam semiconductor laser in which the emission regions can be independently driven and the laser beams emitted from the emission regions can be independently controlled.

In the semiconductor laser of this embodiment, the etching stopper layer 306 between the mesa portions 341 and 342 is removed, and thus the beam emission at the areas of the active layer 304 which positionally correspond to the respective mesa portions 341 and 342 can be excellently and independently controlled between these areas so that no affection is mutually given to each other. In other words, since no etching stopper layer 306 exists between the mesa portions 341 and 342, the current cross-talk concerned never occurs.

Figure 11A:
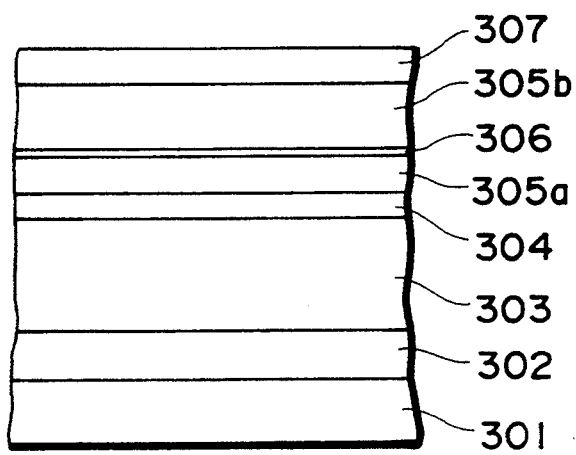
FIGS. 11A and 11B are cross-sectional views for a manufacturing process of the third embodiment.

FIGS. 11A to 14 are cross-sectional views showing a series of manufacturing processes of the semiconductor laser as described above. First, as shown in FIG. 11A, the buffer layer 302 of 0.2 μm thickness, the first cladding layer 303 of 1 μm thickness, the active layer 304 of 0.08 μm, the second inner cladding layer 305a of 0.3 μm, the etching stopper layer 306 of 70Å thickness, the second outer cladding layer 305b of 0.7 μm thickness and the p-type cap layer 307 of 0.135 μm thickness are epitaxially grown in this order on the Si-GaAs semiconductor substrate 301 ((100) direction) about 70 μm by an organic metal vapor growth method, Subsequently, as shown in FIG. 11B, A striped silicon nitride film 345 extending in a direction vertical to the drawing surface is formed through a patterning process, and the cap layer 307 and the second outer cladding layer 305b are etched using the silicon nitride film 345 as a mask. The following etchants I and II are used in the above etching process.

Etchant I . . . mixture of concentrated sulfuric acid, hydrogen peroxide and water (concentrated sulfuric acid:hydrogen peroxide:water=5:1:1) which is heated at 50° C.

Etchant II . . . concentrated sulfuric acid heated at 60° C.

The etching rate of each of the etchants I and II for GaInP and AlGaInP and AlGaInP are listed in the following table 1.

TABLE 1

|  | GaInP | AlGaInP |
|---|---|---|
| ETCHANT I | 0.09 μm/min | 0.18 μm/min |
| ETCHANT II | 0.016 μm/min | 0.5 μm/min |

After the silicon nitride film 345 is formed, the etching treatment is first carried out using the etchant I for 100 seconds. Through this treatment, the cap layer 307 at areas other than the area where the silicon nitride film 345 is formed is removed, and the outer cladding layer 305b is slightly etched.

Figure 11B:
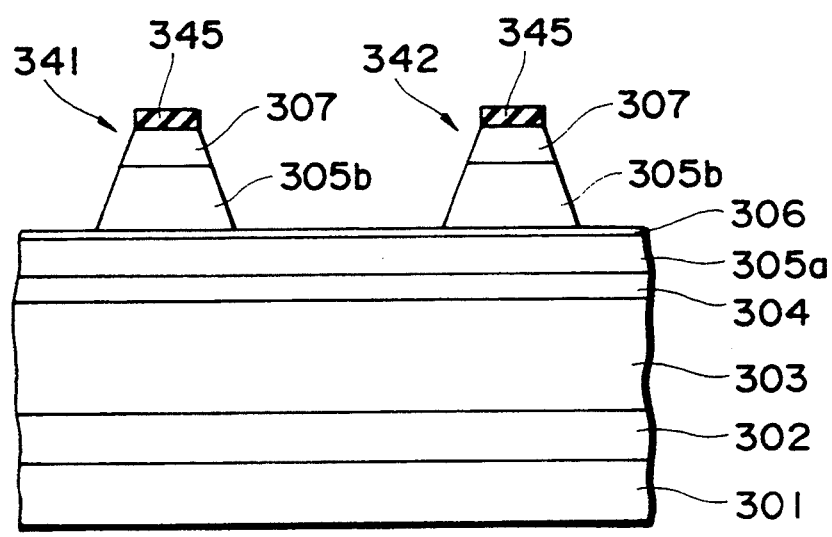

Subsequently, the etching treatment is carried out using the etchant II for 85 seconds. The etching with the etchant II is stopped at the etching stopper layer 306. Through this process, the state as shown in FIG. 11b is obtained.

Conventionally, the etching process is finished in the above state. In this embodiment, however, the etching treatment is further carried out using the etchant I for 10 seconds from the state as shown in FIG. 11B, so that the etching stopper layer 306 at areas other than the areas corresponding to the mesa portions 341 and 342 are removed by the etching treatment, and the inner cladding layer 305a is slightly etched. This state is shown in FIG. 11C. In this state, no etching stopper exists between the neighboring mesa portions 341 and 342.

Figure 12A:
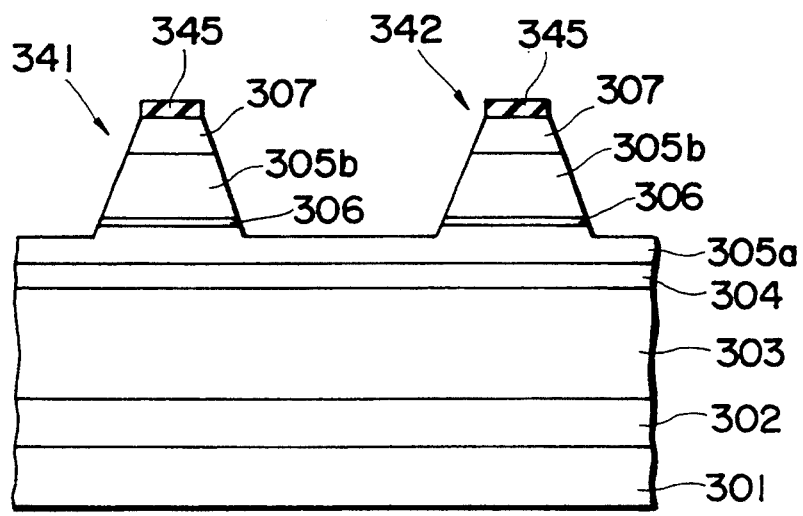
FIGS. 12A and 12B are respectively cross-sectional views for another manufacturing process of the third embodiment.
Figure 12B:
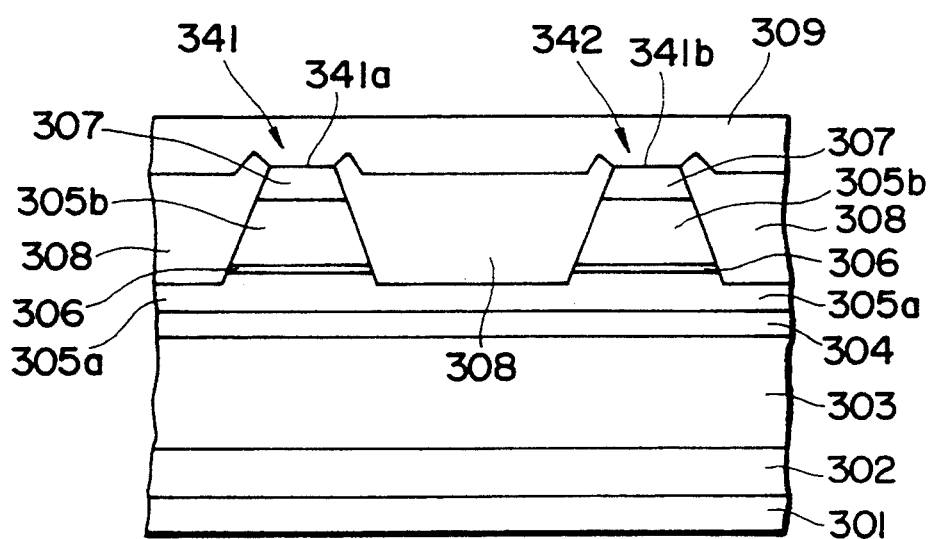

From the state as shown in FIG. 12A, for example, a silicon nitride film (not shown) is further formed on the tip portions 341a and 342a of the mesa portions 341 and 342, and the current block layers 308 are selectively and epitaxially grown at both sides of the mesa portions 341 and 342 by the organic metal vapor growth method using the silicon nitride film as a mask. The silicon nitride film as described above is removed, and then the contact layer 309 is epitaxially grown to obtain a state as shown in FIG. 12B.

Figure 13A:
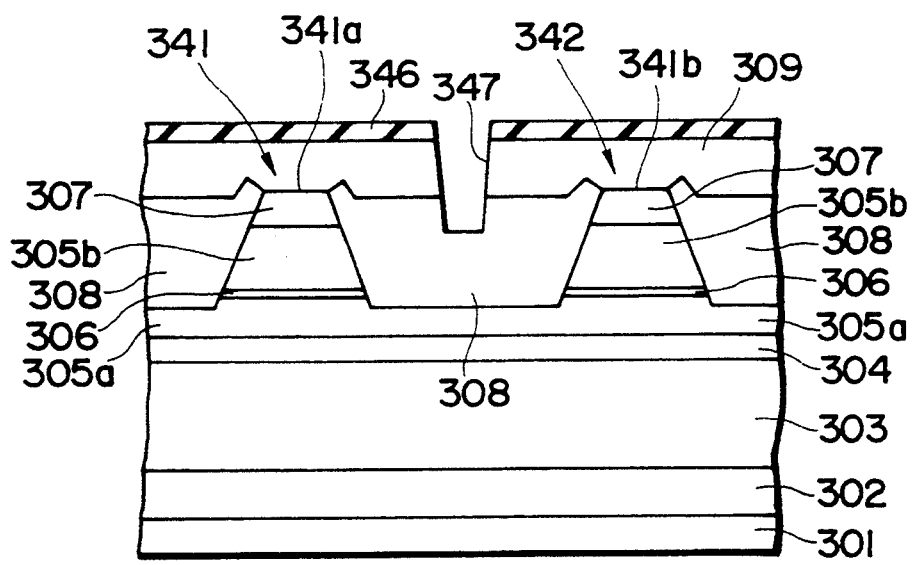
FIGS. 13A and 13B are respectively cross-sectional views for another manufacturing process of the third embodiment.
Figure 13B:
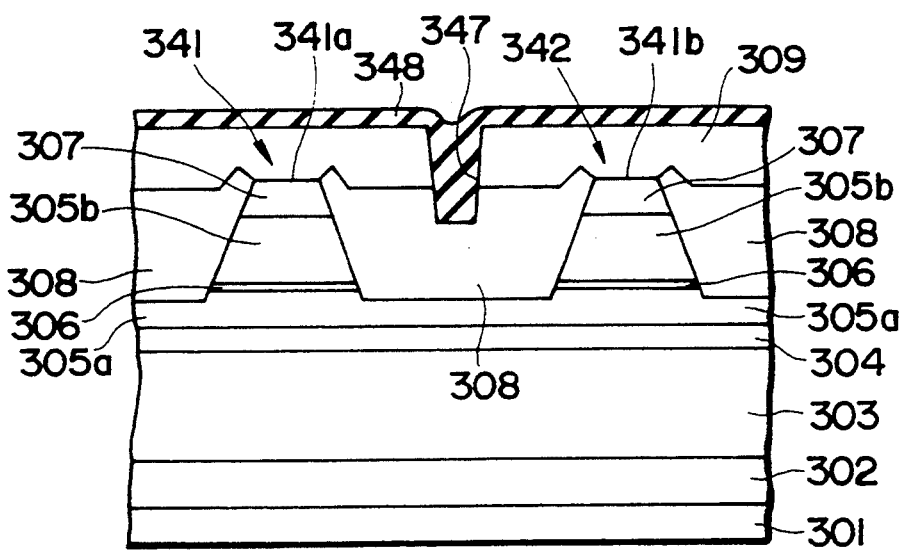

Subsequently, as shown in FIG. 13A, a silicon nitride film 406 is formed by a patterning process, and then the etching treatment is carried out using the patterned silicon nitride film 406 as a mask to form a groove 347 in such a depth that it extends the current block layer 308 between the mesa portions 341 and 342. After the formation of the groove 347, the silicon nitride film 346 is removed, and a new silicon nitride film 348 is formed over the whole surface as shown in FIG. 13B.

Figure 14:
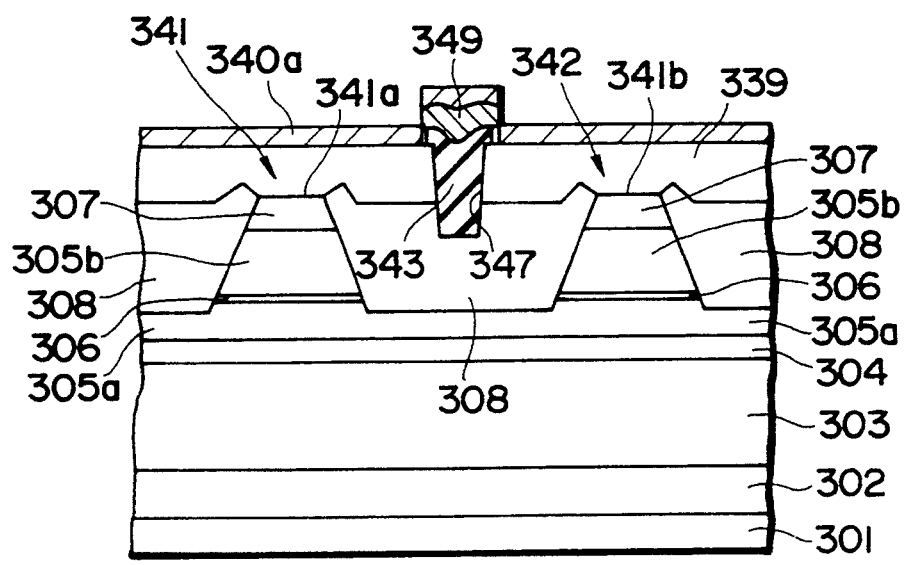
FIG. 14 is a cross-sectional view of another manufacturing process of the third embodiment.

Subsequently, a resist film 349 is patterned on the groove 347 by the lithography technique, and the silicon nitride film 348 is patterned using the resist film 349 as a mask. Through this process, the patterned silicon nitride film 343 as shown in FIG. 14 is obtained.

In the state where the resist film 349 is formed on the silicon nitride film 343, a metal film 340a comprising a three-layered film of Ti/Pt/Au is further formed over the whole surface. The metal film 340a on the silicon nitride film 343 is removed together with the resist film 349 by the etching treatment. Through this process, the positive electrode 340 which is divided through the silicon nitride film 343 as shown in FIG. 10 is obtained.

Finally, the negative electrode 344 comprising a three-layered film of AuGe/Ni/Au is formed on the back surface of the substrate, thereby forming the semiconductor laser as shown in FIG. 10.

In the semiconductor laser as produced by the above method, the etching stopper layer 306 between the mesa portions 341 and 342 is completely removed, so that the laser beams emitted from the areas of the active layer 334 which correspond to the mesa portions 341 and 342 can be independently controlled with no cross-talk.

Further, by stopping the etching treatment of the outer cladding layer 305b at the etching stopper layer 306, the etching of the outer cladding layer 305b is made uniform over all portions. Thereafter, the thin etching stopper 306 is removed by the etching treatment, so that the thickness d of the inner cladding layer 305a between the mesa-shaped portions 341 and 342 is kept to be uniform over all portions. As a result, the characteristics of the laser beams emitted from the areas of the active layer 304 which respectively correspond to the mesa portions 341 and 342 are made uniform.

This invention is not limited to the above embodiment. For example, the above embodiment is applied to an AlGaInP-group semiconductor laser, however, may be applied to semiconductor lasers of other material groups. Specifically, the following materials as listed in the following table 2 are preferably used as etchants having the same roles as the etchants I and II for combination of the cladding materials and the etching stopper materials of the semiconductor laser.

TABLE 2

| CLAD | ETHCHING STOPPER | SUBSTRATE | ETCHANT I | ETCHANT II |
|---|---|---|---|---|
| AlGaInP | GaInP | GaAs | S.A. | S.A.:H.P.:W (5:1:1) |
| AlGaInP | AlGaInP | GaAs | S.A. | S.A.:H.P.:W (5:1:1) |
| AlGaInP | AlGaAs | GaAs | S.A. | P.A.:H.P.:W (5:1:40) |
| AlGaInP | GaAs | GaAs | S.A. | P.A.:H.P.:W (5:1:40) |
| GaInP | AlGaAs | GaAs | H.A. | P.A.:H.P.:W (5:1:40) |
| GaInP | GaAs | GaAs | H.A. | P.A.:H.P.:W (5:1:40) |
| InP | AlInAs | InP | H.A. | P.A.:H.P.:W (5:1:40) |
| InP | GaInAs | InP | H.A. | P.A.:H.P.:W (5:1:40) |

S.A.: sulfuric acid, H.P.: hydrogen peroxide, W: water, H.A.: hydrochloric acid, P.A.: phosphoric acid
AlGaInP*: Al composition amount of etching stopper is lower than that of clad.

Here, defining "(etching rate of etching stopper material)/(etching rate of cladding material)=speed ratio", the speed ratio of the etchant II is preferably as large as possible (in the table 1, speed ratio=about 31), and the speed ratio of the etchant I is preferably as small as possible (in the table 1, speed ratio=2). No problem would occur in the actual manufacturing process if the speed ratio of the etchant II is above 10 and the speed ratio of the etchant I is below 3.

Further, in the embodiments as described above, the multi-beam semiconductor laser for generating two laser beams is typically described. However, this invention may be easily applicable to a multi-beam type semiconductor laser in which three or more laser beams are emitted.

Still further, this invention is not limited to the multi-beam type semiconductor laser, and may be applied to a single-beam type semiconductor laser. In this case, the etching stopper at areas other than an area having the current enclosing structure may be removed to prevent diffusion of current and improve emission efficiency of laser beam.

In the above embodiments, this invention is applied particularly to the semiconductor laser. However, this invention may be widely applied to semiconductor device in which a blocking characteristic may be varied due to presence of an etching stopper when a semiconductor layer is patterned with the etching stopper to improve uniformity in etching.

The method of using the etching stopper layer and then removing this layer in the third embodiment is carried out on the assumption that it is applied to the multi-beam semiconductor laser as disclosed in the first and second embodiments. However, the third embodiment is not limitedly applicable to this type of multi-beam semiconductor laser. That is, the third embodiment is applicable to any multi-beam semiconductor laser adopting the independent driving operation. For example, as described in the third embodiment, the etching stopper layer may be used when the second inner cladding layer of the tentatively-made semiconductor laser as shown in FIG. 1 is formed.

This invention aims at the implementation of multiple beams in a semiconductor laser having a cladding layer formed of AlGaInP group. However, the material of the semiconductor laser is not limited to the above material group. For example, this invention may be applied to a so-called AlGaAs-group semiconductor laser having a wavelength band of 0.79 to 1.1 $\mu$m. In this case, (Al)GaInAs is used for a strain active layer. Further, when a semiconductor laser having the same wavelength band (0.78 to 1.1 $\mu$m) is implemented, in place of the cladding layer formed of AlGaAs, GaInP or AlGaInP is proposed to be used. This invention may be applicable to this case. Further, this invention is also applicable to a GaInAs semiconductor laser having a wavelength band of 1.3 to 1.6 $\mu$m.

The composition ratio of the constituent materials and the thicknesses of the layers in the above embodiments are merely disclosed as an example, and thus these values may be suitably altered case by case.

The semiconductor laser which has been presently used to perform recording and reproducing operations for a laser printer and an optical disk is formed of AlGaAs group and has wavelength about 0.78 to 0.84 $\mu$m. However, the semiconductor laser of GaInP or AlGaInP-group which is capable of generating laser beam having wavelength about 0.6 to 0.7 $\mu$m, has advantages that an light spot can be easily converged in small diameter and that a high-sensitive material can be used for the laser printer.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A multi-beam semiconductor laser comprising:
   an active layer;
   a first and second cladding layer sandwiching said active layer, said second cladding layer being made of a first material;
   a contact layer provided on said second cladding layer;
   a current block means provided in said second cladding layer, said current block means being made of a second material and being spaced from said active layer with a predetermined distance;
   dividing means provided above said current block means for physically dividing said contact layer into two areas; and
   electrodes respectively provided on said divided areas of said contact layer.

2. A multi-beam semiconductor laser according to claim 1 further comprising:
   a cap layer provided between said second cladding layer and said contact layer.

3. A multi-beam semiconductor laser according to claim 1, wherein said active layer is made of (Al)GaInP (including having no Al component).

4. A multi-beam semiconductor laser according to claim 1, wherein said first and second cladding layer are made of Al(Ga)InP (including having no Ga component).

5. A multi-beam semiconductor laser according to claim 1, wherein said active layer has a multiple quantum well structure.

6. A multi-beam semiconductor laser according to claim 1, wherein a resistance of said second material is higher than that of said first material.

7. A multi-beam semiconductor laser according to claim 1, wherein a conductivity type of said first material is different from that of said second material.

8. A multi-beam semiconductor laser according to claim 1, wherein said dividing means comprises a groove formed in said contact layer and a bottom of said grooves reaches to said current block means.

9. A multi-beam semiconductor laser according to claim 1, wherein said dividing means comprising a block made of insulative material and said block reaches to said current block means.

10. A multi-beam semiconductor laser according to claim 1, wherein said predetermined distance is shorter than 0.5 $\mu$m.

11. A multi-beam semiconductor laser according to claim 1, further comprising etching blocking layer provided in said second cladding layer, said etching blocking layer being made of a material having a etching rate smaller than that of said cladding layer and said etching blocking layer being physically divided by said current block means into two parts.

12. A process for producing a multi-beam semiconductor laser comprising:
   a step of forming an active layer;
   a step of forming a first cladding layer made of a first material on said active layer;
   a step of forming an etching blocking layer made of a second material on said first cladding layer;
   a step of forming a second cladding layer made of a third material on said etching blocking layer;
   a step of etching a prescribed region of said second cladding layer till said etching blocking layer is exposed by first etchant;
   a step of etching said exposed region of said etching blocking layer till said first cladding layer is exposed by second etchant; and,
   a step of forming a current block means on said exposed region of said first cladding layer.

13. A process for producing a multi-beam semiconductor laser according to claim 12, wherein a first ratio of etching rate of a the second material to etching rate of the first material in the first etchant is larger than a second ratio of etching rate of the second material to etching rate of the third material in the second etchant.

14. A process for producing a multi-beam semiconductor laser according to claim 13, wherein said first ratio is above 10 and said second ratio of the etchant is below 3.

* * * * *